United States Patent [19]

Bockett-Pugh

[11] 4,009,414
[45] Feb. 22, 1977

[54] BAR DISPLAY WITH SCALE MARKERS

[75] Inventor: Charles Paul Bockett-Pugh, Bracknell, England

[73] Assignee: Honeywell Inc., Minneapolis, Minn.

[22] Filed: Nov. 24, 1975

[21] Appl. No.: 634,761

[30] Foreign Application Priority Data

Nov. 27, 1974 United Kingdom ............ 51325/74

[52] U.S. Cl. .................... 315/169 R; 340/324 R; 340/343; 340/166 EL
[51] Int. Cl.² .................................. H05B 37/00
[58] Field of Search ..... 315/169 R, 169 TV, 169 T; 340/377, 324 R, 324 M, 324 AD, 325, 166 EL, 381, 343

[56] References Cited
UNITED STATES PATENTS

| | | | |
|---|---|---|---|
| 3,221,170 | 10/1965 | Sylvander | 315/169 R |
| 3,328,790 | 6/1967 | Rhodes | 315/169 R |
| 3,351,928 | 10/1967 | Smola | 315/169 R |
| 3,582,944 | 6/1971 | Kashio | 340/343 |
| 3,944,875 | 3/1976 | Owaki et al. | 340/324 M |

*Primary Examiner*—Eugene La Roche
*Assistant Examiner*—Tommy P. Chin
*Attorney, Agent, or Firm*—Laurence J. Marhoefer; Lockwood D. Burton

[57] ABSTRACT

A bar graph device has a column of 200 cathodes connected in three sets which are energized in sequence to give a visible gas discharge which travels up the column from a reset cathode. The cathode drive is from a clock which also drives a sawtooth which is compared with the input signal. When equality occurs, the anode is de-energized to extinguish the discharge. Cathode drive continues until all cathodes in the column have been energized. Divide-by-200 circuitry ensures proper resetting. Scale markers are provided in the display itself by splitting the divide-by-200 circuit as shown, and using the pulses from the divide-by-5 section to fire a one-shot and a disable gate for, say, three clock pulses. This effectively freezes the system after every five pulses passing through the gate, resulting in the display in the device dwelling on every fifth cathode; these cathodes, therefore, appearing brighter than the rest.

4 Claims, 1 Drawing Figure

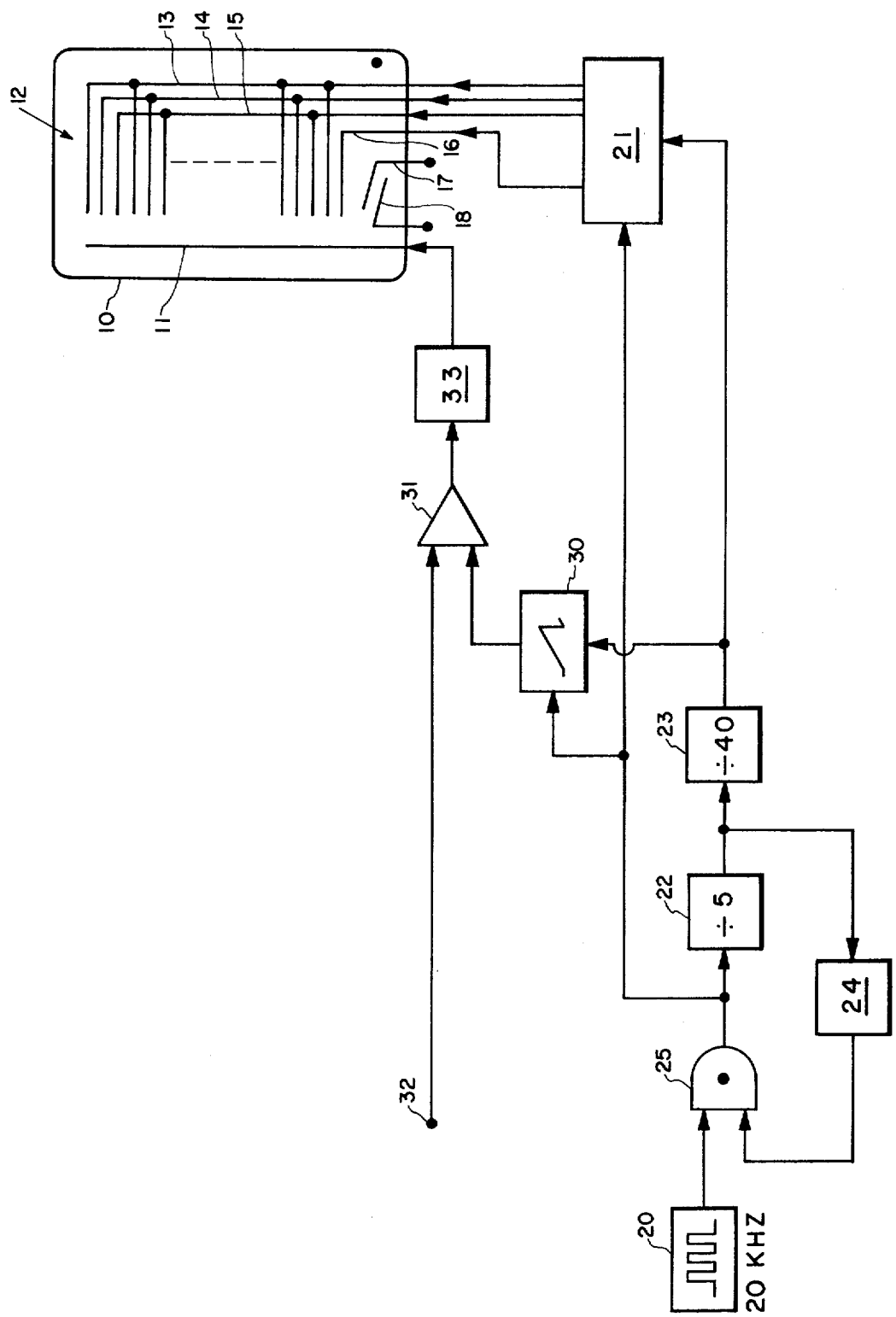

BAR DISPLAY WITH SCALE MARKERS

BACKGROUND OF THE INVENTION

1. Field of the Invention

The present invention relates to bar displays, and more specifically, to the production of scale markers therefor.

2. Description of the Prior Art

A bar display device has become known which comprises a flat bar-like gas-filled space having a transparent main anode on its inner front face and a large number of equally spaced cathodes arranged like the rungs of a ladder on the back face of the bar; the cathodes being connected in three interdigitated sets. A "keep-alive" anode, a "keep-alive" cathode, and a reset cathode are arranged at one end of the device. By energizing the reset cathode and then the three main sets of cathodes by a three-phase drive driven by a master clock circuit, a visible gas discharge is produced at one end of the device and then stepped rapidly along the bar from cathode to cathode, appearing as a continuous bar of light. By de-energizing the main anode at a chosen instant, the length of this bar can be controlled.

For a simple display of a variable input quantity, drive circuitry is used comprising means for continuously driving the cathodes with a three-phase drive, a ramp generator synchronized with the cycling of the display, and a comparator which compares the input quantity with the ramp signal and turns the anode voltage off when equality occurs.

This display is self-illuminating, and the use of a normal printed scale on the outside of the display is therefore inconvenient in some circumstances, since the scale will require external illumination to be visible. Further, such a scale must either be on the inside of the display, in which case it is determined for all time when the device is being manufactured, or on the outside, in which case there is the possibility of a parallax error between the display itself and the scale.

SUMMARY OF THE INVENTION

Accordingly, the present invention provides a bar display system comprising:
a bar display device having a multiplicity of electrodes arranged in a column and connected in at least three interdigitated sets;
a clock signal generator;
a display drive circuit driven by the clock signal generator for energizing each set of electrodes in sequence;
a ramp signal generator operated in synchronism with the energization of the bar display device;
a comparator for comparing an input signal with the ramp generated by the ramp signal generator;
display control means for changing the energization of the display when the output of the comparator changes; and
scale marker means comprising a divide-by-n circuit which is driven by the clock signal generator and the pulses from which modify the energization of the display: n is, of course, an integer greater than 1.

The output pulses from the scale-of-n circuit preferably increase the brightness of the corresponding elements of the display. This can be achieved either by modifying the anode voltage or by increasing the dwell time on those elements. The latter technique requires the ramp generator to be frozen for the increased dwell time.

By providing two counters in series, every m-th one of the marker elements can be further brightened.

BRIEF DESCRIPTION OF THE DRAWING

An embodiment of the invention will now be described, by way of example, with reference to the accompanying single FIGURE drawing, which is a simplified block diagram.

PREFERRED EMBODIMENT OF THE INVENTION

Referring to the drawing, the display device 10 is a long flat bar-shaped enclosure filled with gas. A transparent anode 11 extends along its front face, and 200 cathodes 12 form the rungs of a ladder along its back face, all but one of these cathodes being connected together in three sets 13, 14 and 15 as shown. At one end of the device there is a reset cathode 16, a keep-alive cathode 17, and a keep-alive anode 18. The keep-alive anode and cathode are permanently energized in conventional manner (not shown).

To drive the cathodes, a master clock 20 running at 20 kHz drives a three-phase display drive circuit 21 which energizes the three sets of cathodes 13, 14 and 15 in sequence. The master clock 20 also feeds divide-by-200 circuitry (counters 22 and 23 in series) which generates a reset pulse for every 200 pulses from the master clock. This reset pulse is fed to the display drive circuit 21, to temporarily de-energize the three sets of cathodes 13, 14 and 15 and energize the reset cathode 16. Each reset thus establishes the discharge in the device at the reset cathode, and the three-phase drive thereafter steps the discharge along the device cathode by cathode.

The master clock 20 also drives a ramp generator 30, which produces a ramp which increases in equal steps with the pulses from the master clock. The output of the ramp generator is fed to a comparator 31, which is also fed from input terminal 32 with the signal to be displayed. When the ramp voltage passes the input voltage, the comparator output changes level. The comparator feeds an anode drive circuit 33, which maintains the anode 11 energized while the input signal exceeds the ramp voltage but de-energizes the anode when the comparator output changes. The discharge, therefore, steps along the device only until the comparator output changes at which point it is extinguished.

The reset pulse from the divide-by-200 circuitry is also fed to the ramp generator 30, to reset it with the device 10.

In order to generate scale or marker pulses, the divide-by-200 circuitry is split into a divide-by-5 circuit 22 and a divide-by-40 circuit 23. The output of the divide-by-5 circuit 22 drives a one-shot circuit 24 which controls a gate 25 gating the output of the master clock 20, so that after every five pulses there is a dwell time before the pulse stream from gate 25 recommences. The one-shot 24 may be set to delete any number of pulses between 1 and 4 each time it is fired.

The effect of this is that, after every fifth pulse from the gate 25, there is an extended dwell time. The discharge in the device 10, therefore, remains at the same cathode for this extended time and that cathode, therefore, appears brighter. Every fifth cathode is thus brightened and the display, therefore, has scale markers introduced every fifth cathode. The scale thus generated only appears over the illuminated part of the display; it does not extend along its whole length.

In the system described, the ramp generator 30 is driven by the master clock. If a ramp generator is used which is free-running, in the sense that its slope is constant and it cannot be halted part way up its slope, then the system must be modified.

The one-shot 24 and the gate 25 must be removed, and the output of the divide-by-5 circuit fed to the anode drive circuit 33. This circuit must be modified to provide an increased anode voltage in response to the pulses from the divide-by-5 circuit. Every fifth element in the display will then be brightened as before.

It is evident that, if desired, say every fourth one of the brightened elements may be further brightened by splitting the divide-by-40 circuit into a divide-by-4 circuit and a divide-by-10 circuit, and using the divide-by-4 circuit to further brighten every twentieth element in the same way as the divide-by-5 circuit 22 brightens every fifth element.

If a scale extending over the whole length of the device is required, this can be achieved by using alternate scans of the display to display the voltage at terminal 32 and the scale markers. This will, however, result in the whole length of the device being illuminated, the input voltage at terminal 32 being indicated by a brighter portion of the display.

The embodiments of the invention in which an exclusive property or privilege is claimed are defined as follows:

1. A bar display system comprising:
    a bar display device having a multiplicity of electrodes arranged in a column and connected in at least three interdigitated sets;
    a clock signal generator;
    a display drive circuit driven by the clock signal generator for energizing each set of electrodes in sequence;
    a ramp signal generator operated in synchronism with the energization of the bar display device;
    a comparator for comparing an input signal with the ramp generated by the ramp signal generator;
    display control means for changing the energization of the display when the output of the comparator changes; and
    scale marker means comprising a divide-by-n circuit which is driven by the clock signal generator and the pulses from which modify the energization of the display.

2. A bar display system according to claim 1 wherein the divide-by-n circuit drives a one-shot circuit which in turn controls a gate which gates the output of the clock signal generator, such that each output pulse from the divide-by-n circuit prevents the passage through the gate of a predetermined number of pulses from the clock pulse generator.

3. A bar display system according to claim 1 wherein the divide-by-n circuit feeds the display control means so as to change the illumination of the display on each pulse from the divide-by-n circuit.

4. A bar display system according to claim 3 wherein the divide-by-n circuit drives a divide-by-m circuit the output pulses from which further modify the energization of the display.

* * * * *